(12) United States Patent  
Berry et al.

(10) Patent No.: US 9,128,382 B2  
(45) Date of Patent: Sep. 8, 2015

(54) PLASMA MEDIATED ASHING PROCESSES THAT INCLUDE FORMATION OF A PROTECTIVE LAYER BEFORE AND/OR DURING THE PLASMA MEDIATED ASHING PROCESS

(71) Applicant: Lam Research Corporation, Fremont, CA (US)

(72) Inventors: Ivan Berry, Amesbury, MA (US); Orlando Escorcia, Falls Church, VA (US); Keping Han, Beverly, MA (US); Jianan Hou, Lexington, MA (US); Shijian Luo, South Hamilton, MA (US); Carlo Waldfried, Middleton, MA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 14/072,304

(22) Filed: Nov. 5, 2013

(65) Prior Publication Data

US 2014/0103010 A1    Apr. 17, 2014

Related U.S. Application Data

(62) Division of application No. 12/398,390, filed on Mar. 5, 2009, now abandoned.

(60) Provisional application No. 61/033,969, filed on Mar. 5, 2008, provisional application No. 61/037,589, filed on Mar. 18, 2008.

(51) Int. Cl.
| | | |
|---|---|---|
| C23F 1/00 | (2006.01) | |
| B44C 1/22 | (2006.01) | |
| G03F 7/38 | (2006.01) | |
| G03F 7/42 | (2006.01) | |

(Continued)

(52) U.S. Cl.
CPC ...... G03F 7/38 (2013.01); G03F 7/427 (2013.01); H01J 37/32449 (2013.01); H01L 21/31138 (2013.01)

(58) Field of Classification Search
CPC ...... H01L 21/31138; G03F 7/427; G03F 7/38; B44C 1/22; H01J 37/32449
USPC .................. 216/37, 41, 67; 438/710, 725
See application file for complete search history.

(56) References Cited

U.S. PATENT DOCUMENTS

| | | | |
|---|---|---|---|
| 5,545,289 A | * | 8/1996 | Chen et al. ............... 438/694 |
| 6,379,576 B2 | | 4/2002 | Luo et al. |
| 6,756,085 B2 | | 6/2004 | Waldfried et al. |

(Continued)

OTHER PUBLICATIONS

U.S. Appl. No. 11/684,513, filed Mar. 2007, Schaefer et al.

*Primary Examiner* — Shamim Ahmed

(57) ABSTRACT

A method for processing a substrate includes arranging a substrate including masked portions and unmasked portions in a process chamber; creating plasma in a process chamber; supplying a passivation gas mixture that includes nitrogen or carbon to create a plasma passivation gas mixture; exposing a substrate to the plasma passivation gas mixture to create a passivation layer on the unmasked portions of the substrate; supplying a stripping gas mixture that includes oxygen to the plasma to create a plasma stripping gas mixture; exposing the substrate to the plasma stripping gas mixture to strip at least part of the masked portions and at least part of the unmasked portions; and repeating creating the passivation layer and the stripping to remove a predetermined amount of the masked portions.

21 Claims, 6 Drawing Sheets

(51) Int. Cl.
*H01J 37/32* (2006.01)
*H01L 21/311* (2006.01)

(56) References Cited

U.S. PATENT DOCUMENTS

| | | | |
|---|---|---|---|
| 7,018,928 B2 | 3/2006 | Hsu et al. | |
| 7,153,542 B2 | 12/2006 | Nguyen et al. | |
| 7,288,491 B2* | 10/2007 | Collins et al. | 438/780 |
| 2004/0100289 A1 | 5/2004 | Lull | |
| 2007/0093033 A1 | 4/2007 | Wang et al. | |
| 2007/0193602 A1 | 8/2007 | Savas et al. | |
| 2007/0259130 A1 | 11/2007 | Von Kaenel et al. | |
| 2007/0264841 A1 | 11/2007 | Chebi et al. | |
| 2007/0287291 A1* | 12/2007 | George et al. | 438/694 |
| 2008/0261405 A1 | 10/2008 | Yang et al. | |
| 2009/0017563 A1* | 1/2009 | Jiang et al. | 438/4 |
| 2009/0155487 A1 | 6/2009 | Belyansky et al. | |
| 2009/0214799 A1* | 8/2009 | Simard et al. | 427/577 |
| 2009/0277871 A1 | 11/2009 | Berry et al. | |

* cited by examiner

PLASMA MEDIATED ASHING PROCESSES THAT INCLUDE FORMATION OF A PROTECTIVE LAYER BEFORE AND/OR DURING THE PLASMA MEDIATED ASHING PROCESS

CROSS-REFERENCE TO RELATED APPLICATIONS

The present disclosure is a divisional of U.S. patent application Ser. No. 12/398,390 filed on Mar. 5, 2009, which claims the benefit of U.S. Provisional Application No. 61/033,969 filed Mar. 5, 2008, and U.S. Provisional Application No. 61/037,589 filed Mar. 18, 2008. The entire disclosures of the applications referenced above are incorporated herein by reference.

BACKGROUND

The present disclosure generally relates to plasma mediated ashing processes that include formation of a protective layer before and/or during a plasma mediated ashing process.

Plasma mediated ashing, also referred to as stripping, generally refers to an integrated circuit manufacturing process by which residual organic material such as photoresist and post etch residues are stripped or removed from a substrate upon exposure to the plasma. The ashing process generally occurs after an etching or implant process has been performed in which a photoresist material is used as a mask for etching a pattern into the underlying substrate or for selectively implanting ions into the exposed areas of the substrate. The remaining photoresist and any post etch or post implant residues on the wafer after the etch process or implant process is complete must be removed prior to further processing for numerous reasons generally known to those skilled in the art. The ashing step can be followed by a wet chemical treatment to remove traces of the residue.

It is important to note that ashing processes significantly differ from etching processes. Although both processes may be plasma mediated, an etching process is markedly different in that the plasma chemistry is chosen to permanently transfer an image into the substrate by removing portions of the substrate surface through openings in a photoresist mask. The etching plasma generally includes high-energy ion bombardment at low temperatures and low pressures (of the order of millitorr) to remove portions of the substrate. Moreover, the portions of the substrate exposed to the ions are generally removed at a rate equal to or greater than the removal rate of the photoresist mask. In contrast, ashing processes generally refer to selectively removing the photoresist mask and any polymers or residues formed during etching. The ashing plasma chemistry is much less aggressive than etching chemistries and is generally chosen to remove the photoresist mask layer at a rate much greater than the removal rate of the underlying substrate. Moreover, most ashing processes heat the substrate to temperatures greater than 80° C. to increase the plasma reactivity, and are performed at relatively higher pressures (on the order of a torr). Thus, etching and ashing processes are directed to removal of significantly different materials and as such, require completely different plasma chemistries and processes. Successful ashing processes are not used to permanently transfer an image into the substrate. Rather, successful ashing processes are defined by the photoresist, polymer and residue removal rates without affecting or removing underlying layers, e.g., the substrate, low k dielectric materials, and the like.

As devices transition into the 32 nanometer (nm) regimes and beyond, there is growing concern with plasma mediated damage caused by plasma mediated stripping processes. One such area of concern is with the removal of photoresist exposed to high doses during ion implantation in the transistor formation. Typically, sensitive substrate materials such as silicon (implanted, often with very shallow dopants), SiGe, high-k dielectrics, metal gates, etc. are exposed during the photoresist removable process and substrate damage can occur. The substrate damage may be in the form of substrate erosion (e.g., etching, sputtering, physical removal of a portion of the substrate) or by substrate oxidation. The substrate oxidation is undesirable as it will change the electrical, chemical, and physical properties of the substrate layer. For example, in a source and drain implant application, a patterned photoresist layer is formed over the silicon substrate at the source and drain regions prior to carrying out a high dose implant. During the high dose implant, the photoresist is subjected to high energy ions that induce cross-linking reactions to harden an upper shell of the photoresist, commonly referred to as the crust. The physical and chemical properties of the crust vary depending on the implant conditions. Because of this, more aggressive chemistries are needed to remove the resist. At the same time, however, extremely shallow junction depths are calling for very high selectivity. Silicon loss or silicon oxidation from the source/drain regions must be avoided during the high-dose ion implantation strip. For example excessive silicon loss can deleteriously alter the current saturation at a given applied voltage as well as result in parasitic leakage due to decreased junction depth detrimentally altering electrical functioning of the device. The International Technology Roadmap for Semiconductors (ITRS) projects target silicon loss for the 45 nm generation to be 0.4 angstroms per cleaning step and 0.3 angstroms for the 32 nm generation.

Current plasma mediated stripping processes are typically oxygen based followed by a wet clean step. However, oxygen based plasma processes can result in significant amounts of substrate surface oxidation, typically on the order of about 10 angstroms or more. Because silicon loss is generally known to be governed by silicon surface oxidation for plasma resist stripping processes, the use of these oxygen based plasma strip processes by themselves is considered by many to be unacceptable for 45 and 32 nm technology node where almost "zero" substrate loss is required and new materials are introduced such as embedded SiGe source/drain, high-k gate dielectrics, metal gates and NiSi contact which are extremely sensitive to surface oxidation.

Accordingly, there remains a need for improved photoresist resist stripping processes, especially as it relates to the removal of photoresist exposed to high dose implantation.

SUMMARY

Disclosed herein are processes and systems for reducing the loss of substrate material in a plasma mediated photoresist stripping process. In one embodiment, a process for reducing the loss of substrate material in a plasma mediated photoresist stripping process comprises providing a substrate having at least a portion of a surface covered with a material; forming a protective layer on the surfaces free of the material before and/or during the photoresist stripping process, wherein forming the protective layer comprises exposing the substrate to plasma formed from a nitrogen containing gas and/or a carbon containing gas or exposing the substrate to ultraviolet radiation in the presence of the nitrogen containing gas and/or the carbon containing gas; simultaneously removing at least a portion of the material with the plasma mediated stripping process and the protective layer; and repeating the steps of forming the protective layer and removing the at least portion of the material disposed thereon until a desired thickness of the material is removed.

In another embodiment, a process for reducing the loss of substrate material in a plasma mediated photoresist stripping process, the process comprises providing a substrate including a mask of an organic material disposed thereon; forming a protective layer on an exposed surface of the substrate without the mask before and/or during the photoresist stripping process, wherein forming the protective layer comprises exposing the surface to ultraviolet radiation in the presence of an inert gas or a nitrogen containing gas or a carbon containing gas or mixtures thereof; removing at least a portion of the mask and the protective layer with the plasma mediated stripping process; and repeating the steps of forming the protective layer and removing the at least portion of the mask until a desired thickness of the mask is removed.

A plasma processing system for processing an inorganic workpiece substrate having organic material residing thereon by removing the organic material while leaving the inorganic substrate substantially unaltered, comprises a process chamber for processing the workpiece placed therein; a plasma source for delivering excited state gas into said process chamber to produce a reactive environment therein; a gas delivery system, including a plurality of gas valves, for selectively delivering at least one gas from a gas supply to said plasma source; a power generator assembly for powering the plasma source to excite the gas delivered by said gas delivery system; and a control system for selectively activating said gas valves of said gas delivery system so as to provide at least a first selected gas for at least a first selected time interval for forming a protective layer on the substrate, and at least a second selected gas for at least a second selected time interval for removing the organic material residing on the workpiece substrate.

These and other features and advantages of the embodiments of the invention will be more fully understood from the following detailed description of the invention taken together with the accompanying drawings. It is noted that the scope of the claims is defined by the recitations therein and not by the specific discussion of features and advantages set forth in the present description

BRIEF DESCRIPTION OF THE DRAWINGS

The following detailed description of the embodiments of the invention can be best understood when read in conjunction with the following figures, which are exemplary embodiments, in which.

Skilled artisans will appreciate that elements in the figures are illustrated for simplicity and clarity and have not necessarily been drawn to scale.

DETAILED DESCRIPTION

Disclosed herein are processes and systems for reducing the loss of substrate material in a plasma mediated photoresist stripping process. The processes and systems are generally configured to cycle between formation of a protective layer on and/or in an exposed substrate surface and ashing of organic material (e.g., a photoresist mask, anti-reflection coating, and the like) from the substrate surface. As noted above, the protective layer can be applied onto the surface (e.g., via deposition) and/or may be formed in the surface (e.g., via passivation) before and/or during the plasma mediated stripping process. The protective layer serves to protect the exposed surfaces of the substrate from any plasma mediated damage that may occur during the plasma mediated stripping process for removing organic material. The protective layer can be formed via plasma treatment or by ultraviolet radiation (UV) treatment.

Figure 1:
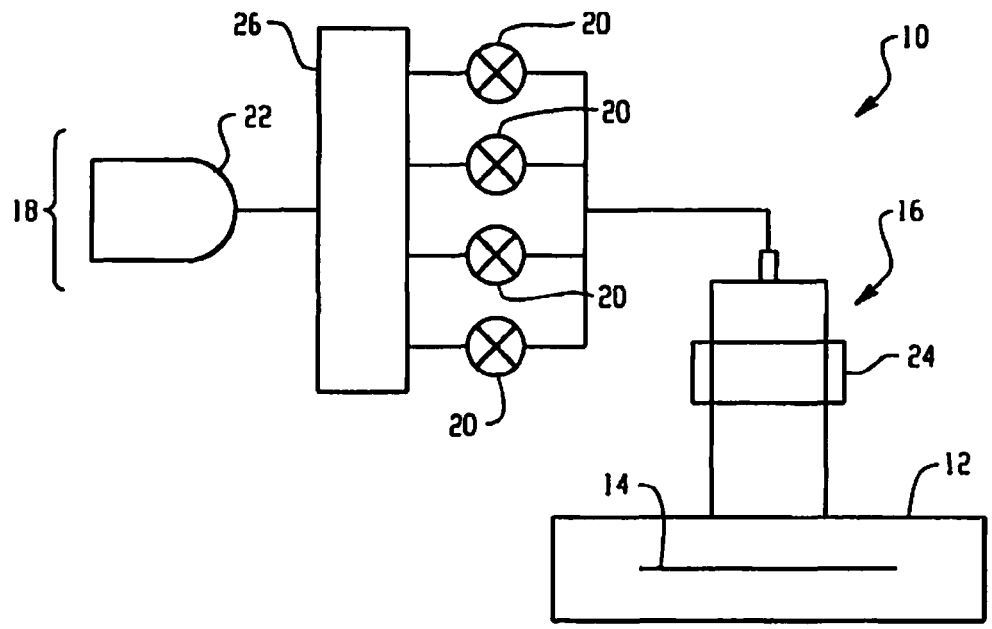
FIG. 1 is a functional block diagram of a substrate processing chamber for a plasma mediated stripping process according to the present disclosure.

Turning now the embodiment shown in FIG. 1, the system 10 for reducing the loss of substrate material in a plasma mediated photoresist stripping process generally includes a process chamber 12 for processing the workpiece 14 placed therein; a plasma source 16 for delivering excited state gas into said process chamber 12 to produce a reactive environment therein; a gas delivery system 18, including a plurality of gas valves 20, for selectively delivering at least one gas from a gas supply 22 to said plasma source 16; a power generator assembly 24 for powering the plasma source to excite the gas delivered by the gas delivery system 18; and a control system 26 for selectively activating said gas valves 20 of said gas delivery system 18 so as to provide at least a first selected gas for at least a first selected time interval for forming a protective layer on the substrate, and at least a second selected gas for at least a second selected time interval for removing the organic material residing on the workpiece substrate.

The processes can be practiced in conventional plasma ashers and are not intended to be limited to any particular plasma asher. For example, a plasma asher employing an inductively coupled plasma reactor could be used or a downstream plasma asher could be used. Other suitable plasma ashers include, but are not limited to, electron cyclotron residence (ECR) systems, radio frequency (RF) systems, hybrid systems, and the like. In one embodiment, the plasma asher is a downstream plasma asher, such as for example, microwave plasma ashers commercially available under the trade name RadiantStrip ES3Ik® from Axcelis Technologies, Inc. in Beverly, Mass. Preferably, the plasma asher provides a stable plasma that can tolerate the variations in gases provided by the cycling between formation of a protective layer on and/or in an exposed substrate surface and ashing of organic material from the substrate surface.

The gas supply includes a plurality of gases, which may include reactive gases and/or inert gases. As used herein the term "reactive gas" generally refers to gases that provide plasma species that can react with the substrate surface to form a passivation layer and/or provide a deposition layer. By way of example, nitrogen ($N_2$) and/or nitrogen containing gases such as $NH_3$, NO, $N_2O_3$, $N_2O$, nitrogen based hydrocarbons, mixtures thereof, or the like can be used to form silicon oxy-nitride or silicon nitride or the like. Similarly, $CO_2$, $CH_4$, HCN, $C_2O$, CO, or mixtures thereof can be used to form silicon carbide (SiC) or silicon carbon nitride (SiCN) or the like. The term "inert" generally refers to plasma species that are substantially non-reactive to the substrate surface. Examples include, without limitation, inert gases such as helium, argon, krypton, xenon, neon, and the like.

The gas supply 18 is in operative communication with the control system 26 such that the first selected gas provided during the first selected time interval is a reactive gas and the second selected gas provided during the second selected time interval is a reactive gas. In this and any other embodiment, the first and second time intervals are cycled until the desired amount of organic material is removed from the substrate surface. In one embodiment, the system is programmed such that the last traces of organic material and the protective layer are simultaneously removed in the final cycle of the plasma mediated tripping process such that the original substrate surface composition is restored. Additional intervals (e.g., third, fourth, etc.) with different gases and/or flow rates can be included, if desired.

In another embodiment, the control system is operative such that the first selected gas provided during the first time interval is an inert gas and the second selected gas provided during the second selected time interval is a reactive gas. It should be noted that in some embodiments, the gas supply provides a plurality of gases that are used to define the first selected gas and/or the second selected gas. A gas delivery system may include a mass flow controller (not shown) for metering and controlling the amount as well as composition of gas into the plasma source. The mass flow controllers are capable of switching the valves 20 between an open state and a closed state in less than one second. Alternatively, a pressure controlled design can be employed.

In one embodiment, the plasma processing system is configured such that the process chamber and the gas delivery system provide a gas flow to the plasma source such that gas flow≥chamber volume÷2 seconds. In one embodiment, the process chamber has a volume of less than 20 liters. The process chamber and the gas delivery system are operative to provide a gas flow rate of at least 1 standard liter per minute (slm).

Figure 2:
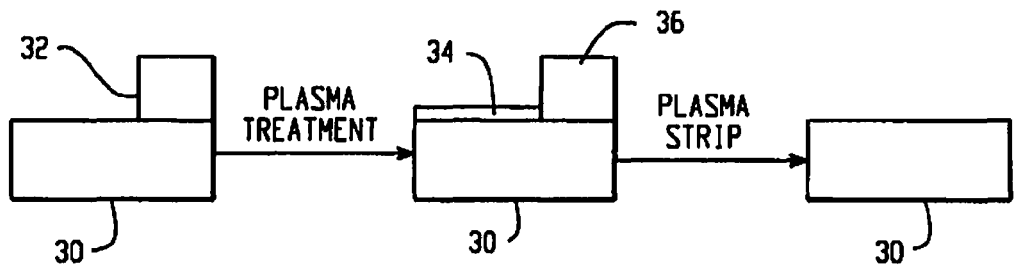
FIG. 2 schematically illustrates a process that includes plasma mediated formation of a silicon oxy-nitride ($SiO_xN_y$) passivation layer before or during the plasma strip process.

FIG. 2 schematically illustrates one embodiment of a process that includes plasma mediated formation of a thin layer of a silicon oxy-nitride ($SiO_yN_z$) (wherein $1 \leq x \leq 2$, and $0 \leq y \leq 2$, and $0 < z \leq 3$) in the substrate surface before and/or during the plasma strip process. As shown, a substrate 30 having a photoresist mask 32 disposed thereon is exposed to a plasma treatment comprising a nitrogen gas and/or nitrogen gas and an inert gas to form a passivation layer 34. The photoresist is then removed by a plasma mediated photoresist stripping process. Both the passivation and stripping processes can be performed in the same plasma reactor. It has been found that passivating the substrate before and/or during the plasma strip process reduces formation of an oxide layer formed during stripping, thereby leading to significantly less substrate material loss relative to processing by the oxygen based plasma alone.

The plasma generated from the nitrogen gas IS substantially non-reactive to photoresist. Other suitable nitrogen-containing plasmas may include ammonia ($NH_3$), a so-called forming gas, which comprises a mixture of the hydrogen gas with the nitrogen gas, and nitrogen-containing hydrocarbons. For a non-load locked plasma chamber configuration, the hydrogen gas ranges in an amount from about 3 percent to about 5 percent by volume of the hydrogen for safety considerations. Upon exposure of the substrate to the nitrogen species generated in the plasma, a nitride passivation layer forms. For a silicon substrate, the nitride layer may take the form of a silicon nitride (e.g., SiNx) and/or may form a silicon-oxynitride ($SiO_yN_z$) (wherein $1 \leq x \leq 2$, and $0 \leq y \leq 2$, and $0 < z \leq 3$) depending on whether a native oxide or otherwise is present on the silicon substrate.

In one embodiment, the process for forming the protective layer is cycled with the plasma mediated stripping process for removing organic material such as photoresist. By way of example, a silicon substrate can be exposed in a suitable plasma reactor to plasma consisting essentially of nitrogen species to form a passivation layer in exposed surfaces of the silicon substrate. The thickness of the passivation layer formed is generally less than 10 angstroms. Once formed, a standard oxygen based plasma stripping process can be employed to remove a portion any organic mask material disposed on the substrate, e.g., photoresist. The protective layer formation/plasma stripping process is cycled until the organic material is removed in the desired amount for the particular application. By stripping the organic material in this manner, the protective layer can be reformed between intervals of the plasma mediated stripping cycle since the previously formed passivation layer has a limited thickness and is simultaneously removed during the plasma mediated stripping process. By cycling the protective layer formation process with the plasma stripping process, the oxide formation can be substantially prevented. For example, in the silicon substrate noted above, the cycled process can be used to substantially prevent formation of silicon dioxide in the exposed portions of the silicon substrate (e.g., without photoresist mask), which is a byproduct of the oxygen based plasma strip process.

In another embodiment, the system 10, as shown in FIG. 1 further includes a UV light source for exposing the workpiece to UV radiation for at least a portion of the first selected time interval for forming the protective layer on the substrate. In one embodiment, the UV light source is provided by the plasma itself. That is, gases are introduced into the plasma source and energized to provide UV radiation.

Alternatively, a UV lamp may be attached to the plasma process chamber and the UV treatment may be performed immediately before, sequentially during, or continuously during the plasma photo resist removal process. By way of example, the UV lamp from a UV radiator tool can be utilized. During use, the light source chamber may be first purged with an inert gas such as nitrogen, helium, or argon to allow the UV radiation to enter an adjacent process chamber with minimal spectral absorption. The substrate containing the organic material thereon is positioned within the process chamber, which is purged separately with nitrogen containing process gases, such as nitrogen, ammonia, and mixtures thereof, with or without additional inert gases. In this regard, the UV treatment can occur at vacuum conditions, or at conditions that are substantially without the presence of oxygen or oxidizing gases. UV generating bulbs with different spectral distributions may be selected depending on the application. The UV light source can be microwave driven, arc discharge, dielectric barrier discharge, electron impact generated or the like. During the UV exposure, the temperature of the substrate may be controlled to about room temperature to about 450° C., optionally by an infrared light source, an optical light source, a hot surface, or the UV light source itself. The process pressure can be less than, greater than, or about equal to atmospheric pressure. The UV power is about 0.1 to about 2,000 mW/cm$^2$ with an exposure time less than 300 seconds, for example.

Figure 3:
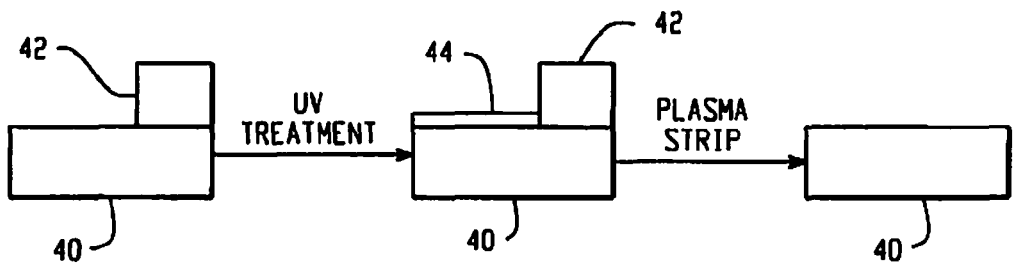
FIG. 3 schematically illustrates a process that includes UV formation of a passivation layer before or during the plasma strip process.

Referring now to FIG. 3, an exemplary process for using the system with the UV light source includes exposing a substrate to a UV treatment in a nitrogen containing, carbon containing, or an inert atmosphere before and/or during the plasma strip process. The process generally includes exposing an inorganic substrate 40 with the photoresist mask 42 thereon to ultraviolet radiation in the presence of a nitrogen containing gas and/or nitrogen gas with or without a non-reactive gas to form a passivation layer. Alternatively, the passivation layer can be formed by a UV-assisted surface modification with a substantially nitrogen free purge environment. The substrate is then exposed to the plasma mediated photoresist stripping process to remove the photoresist. Suitable nitrogen gases include $NH_3$, $N_2$, $N_2O$, $N_2O_3$, NO, nitrogen based hydrocarbons, mixtures thereof and the like. Suitable carbon containing gases include, without limitation, $CO_2$, $CH_4$, HCN, $C_2O$, CO or mixtures thereof. Suitable inert gases include, without limitation, helium, argon, nitrogen, krypton, xenon, neon, and the like.

The plasma mediated organic material stripping process in any of the above described embodiments is not intended to be limited. Suitable plasma mediated stripping chemistries include, without limitation, reducing plasma chemistries, neutral plasma chemistries, or an oxidizing plasma chemistries. For example, a typical oxygen plasma for removing high dose ion implanted photoresist generally includes forming a plasma form a gas mixture of 90 percent $O_2$ and 10 percent forming gas.

Suitable substrates include, but are not limited to, silicon, silicon-germanium, high k dielectric materials, metals, and the like. Advantageously, the process is applicable to any device manufacture where loss of silicon, including amorphous silicon, over a doped region is desirable.

The following examples are presented for illustrative purposes only, and are not intended to limit the scope of the invention.

EXAMPLE 1

In this example, a silicon substrate was exposed to different plasma stripping chemistries in a RapidStrip320 plasma ashing tool commercially available from Axcelis Technologies, Inc. and subjected to surface analysis using XPS. The different chemistries were processed included a standard oxygen based plasma stripping chemistry and a nitrogen plasma passivation chemistry. A control silicon substrate was also analyzed without exposure to any stripping process. The nitrogen plasma passivation chemistry included nitrogen gas at 7000 sccm at a temperature of 240° C. and power setting of 3500 Watts. The standard oxygen plasma stripping chemistry included $O_2$ at 6300 sccm and forming gas ($H_2$ 3%, $N_2$ 97%) at 700 sccm at a temperature of 240° C. and power setting of 3500 Watts. The XPS results are shown in FIGS. 4 and 5.

Figure 4:
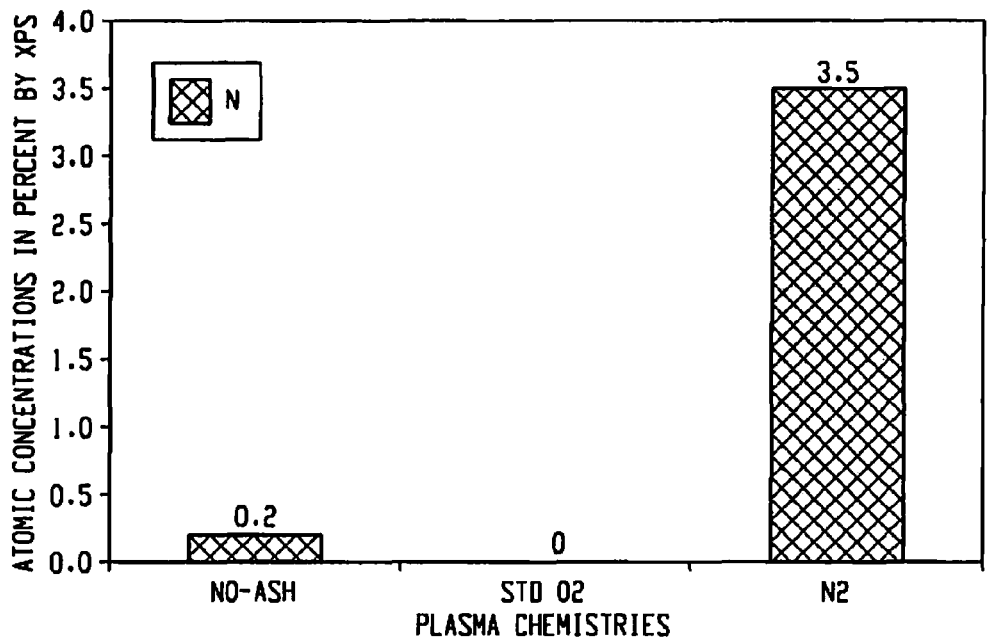
FIG. 4 is a bar chart illustrating atomic nitrogen concentration detected by X-ray Photoelectron Spectroscopy (XPS) analysis for a silicon substrate exposed to a nitrogen passivation plasma, a standard oxygen based plasma recipe, and a no ash control sample.
Figure 5:
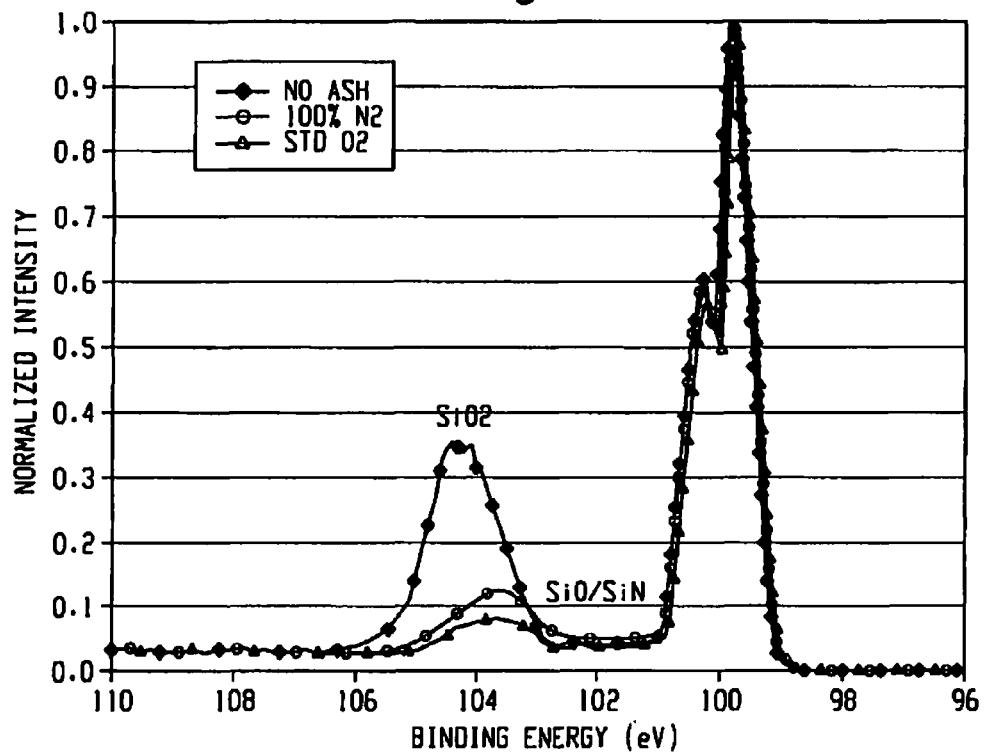
FIG. 5 graphically illustrates high resolution XPS spectra of the Si (2p) signal for a silicon substrate exposed to a nitrogen passivation plasma, a standard oxygen based plasma recipe, and a no ash control sample.

In FIG. 4, the atomic concentration of nitrogen was measured for the three different conditions described above. As shown, there was about 3.5 percent atomic nitrogen concentration detected by XPS analysis for the silicon sample exposed to the nitrogen plasma passivation chemistry for 5 minutes. In FIG. 5, the Si (2p) signal for the nitrogen plasma chemistry revealed a SiNx signature at about 103.3 eV. The Si (2p) signal for the oxygen based plasma chemistry revealed a relatively large $SiO_2$ peak at about 103.7 eV indicating thicker oxide formed.

Figure 6:
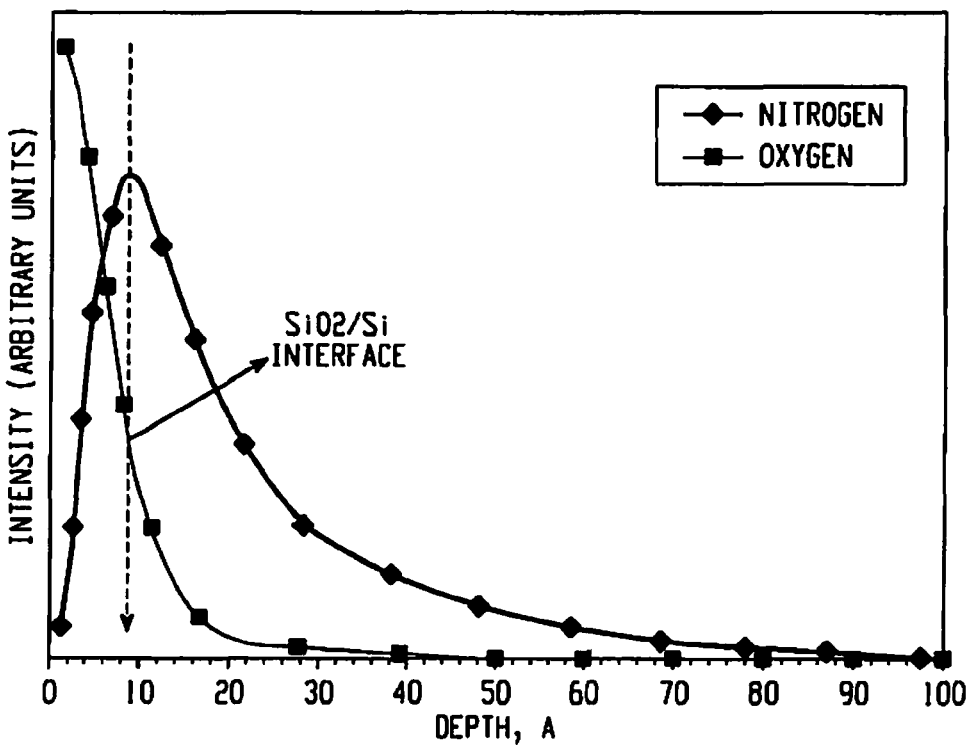
FIG. 6 graphically illustrates Secondary Ion Mass Spectroscopy (SIMS) depth profile of nitrogen and oxygen for a silicon substrate exposed to nitrogen-containing plasma.

In FIG. 6, the oxygen and nitrogen depth profile for the silicon substrate processed with the nitrogen passivation plasma was analyzed using SIMS. The results indicate that the formation of silicon nitride was at the $SiO_2$/Si interface.

EXAMPLE 2

Figure 7:
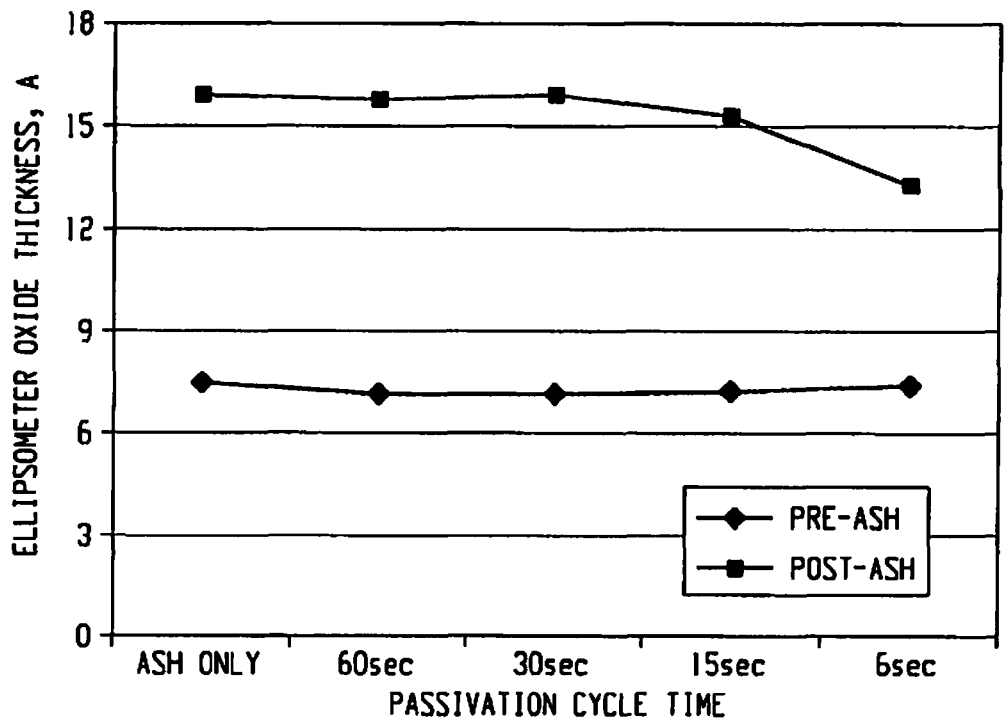
FIG. 7 graphically illustrates oxide thickness as a function of passivation and ashing cycle time for a silicon substrate for both pre ash and post ash conditions, wherein the total passivation time for each substrate was 60 seconds and the total standard oxygen based plasma ashing exposure time was 60 seconds.

In this example, pre-ash and post ash oxide thickness was measured by ellipsometry as a function of the number of passivation and ashing cycles in a RapidStrip320 plasma ashing tool commercially available from Axcelis Technologies, Inc. Substrates were bare silicon wafers. The standard oxygen based plasma of Example 1 was applied for a total of 60 seconds (pulsed into smaller portions as indicated in the Figure where appropriate). The $N_2$ passivation plasma included $N_2$ at 7000 sccm at a temperature of 240° C. and a power setting of 3500 Watts. The total passivation cycle time and ash time were kept constant at 60 seconds (the exception being the ash only process where there was no passivation cycle). That is, a cycle time of 6 seconds means that 10 cycles of 6 seconds were made for a cumulative time of 60 seconds. Likewise, a cycle time of 15 seconds means that 4 cycles of 15 seconds were made for a cumulative time of 60 seconds. After processing, the oxide thickness was measured using an ellipsometer. The results are shown in FIG. 7.

The results clearly show a decrease in oxide growth for both the 15 second and 6 second passivation/ashing cycles. There was no observed difference in oxide thickness after ash for the 60 and 30 second cycles, which was comparable to the ash only result. While not wanting to be bound by theory, it is believed that the passivation layer was too thin to withstand the ash process. By cycling the passivation in relatively shorter cycles, e.g., 15 and 6 second cycles, for the same amount of cumulative time, it is believed that the oxide thickness is increased relative to longer cycles, e.g., 60 second and 30 second cycles. As shown, the post ash oxide thickness was reduced by about 3 angstroms for the 6 second cycle compared to the ashing process without passivation. By forming the passivation layer in situ prior to plasma stripping, silicon loss is minimized and depending on the thickness of the passivation layer can approach zero silicon loss, which meets and exceeds tolerances for advanced device manufacture.

EXAMPLE 3

Figure 8:
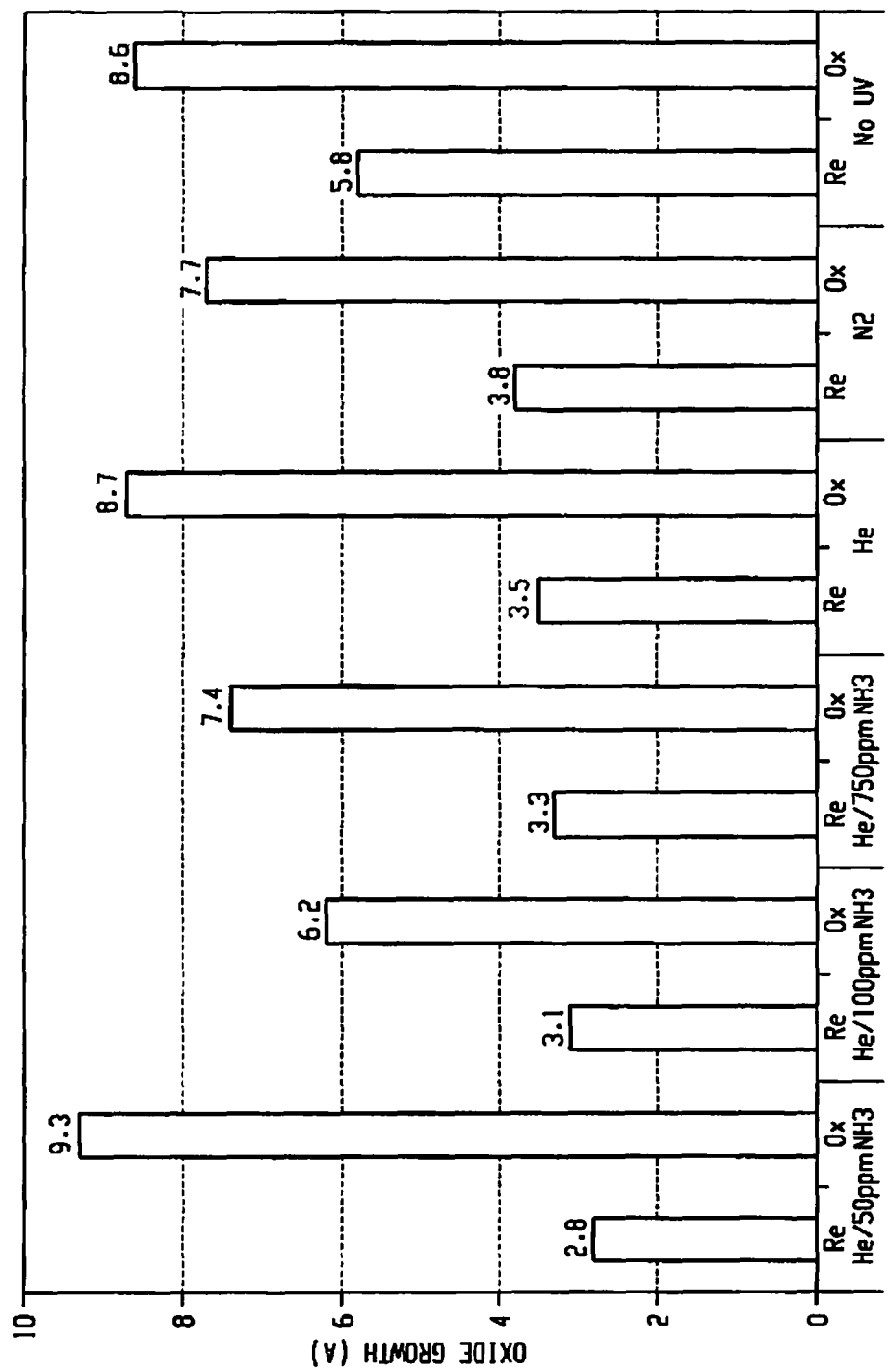
FIG. 8 is a bar chart illustrating oxide growth as a function of exposure to different oxidizing and reducing plasma chemistries with and without a UV pretreatment. The UV passivation exposure time was 5 minutes and the plasma strip exposure time was 30 seconds.

In this example, oxide growth (difference between post and pre-ash oxide thickness) on silicon substrates was measured as a function of exposure to different oxidizing and reducing plasma chemistries with and without a UV pretreatment. For the UV pretreatment, five different gas ambient were examined and included helium plus 50 ppm NH3, helium plus 100 ppm NH3, helium plus 750 ppm $NH_3$, helium only, and nitrogen only. The UV pretreatment included exposure in the particular gas ambient in a prototype of an Axcelis RapidCure320FC system at 400° C. for 5 minutes. Two different UV bulbs were tested, which are commercially available for Axcelis under the names of RC02 and RC08. Wavelength range is between 100 and 400 nm. The substrates were then exposed to the different oxidizing and reducing plasma chemistries in a RapidStrip320 plasma ashing tool commercially available from Axcelis Technologies, Inc. The standard oxygen plasma stripping chemistry included $O_2$ at 6300 sccm and forming gas ($H_2$ 3%, $N_2$ 97%) at 700 sccm at a temperature of 240° C. and power setting of 3500 Watts. The forming gas plasma passivation chemistry included forming gas (a mixture of 97% $N_2$ and 3% $H_2$) at 7000 sccm at a temperature of 240° C. and power setting of 3500 Watts. All plasma exposures were 30 seconds in duration. The results are shown in FIG. 8.

Relative to the silicon substrates that did not include the UV pretreatment, oxide growth was 2 to 3 angstroms less for the UV pretreated substrates exposed to the reducing plasma. UV pretreatment in helium plus 100 ppm $NH_3$ provided was most effective for inhibiting oxide growth induced by both oxidizing and reducing plasmas.

Figure 9:
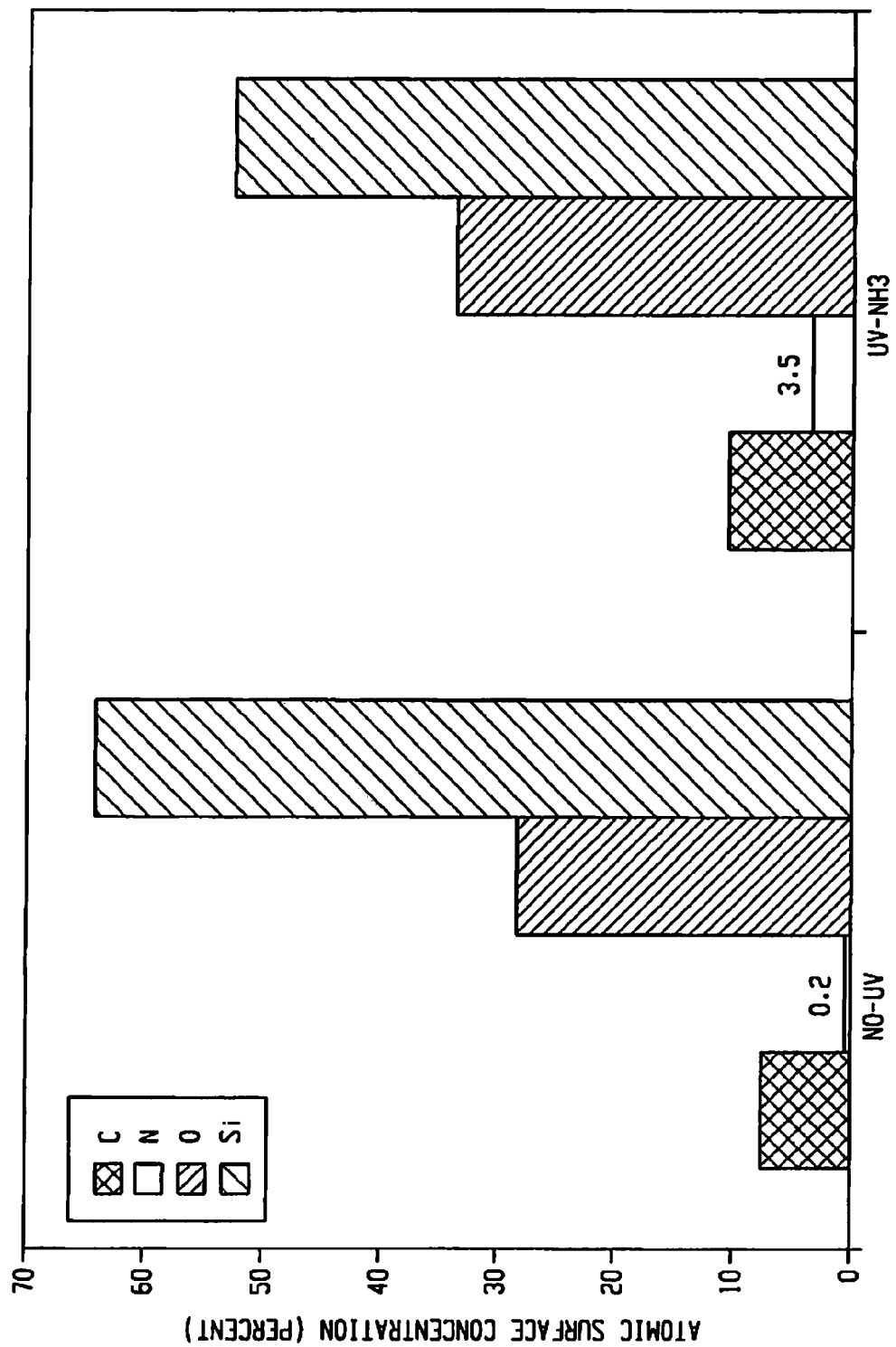
FIG. 9 is a bar chart illustrating atomic surface concentration detected by XPS as a function of UV exposure and no UV exposure for carbon, nitrogen, oxygen and silicon species.

FIG. 9 graphically illustrates surface analysis using XPS for the silicon substrate UV pretreatment in helium plus 100 ppm $NH_3$ compared to the substrate without the UV pretreatment. Atomic nitrogen surface concentration was found to be about 3.5% (dose 6E14) for the UV pretreated substrate. This result suggest formation of nitride in the surface oxide (silicon-oxy-nitride ($Si_xO_yN_z$) ($1 \leq x \leq 2$, and $0 \leq y \leq 2$, and $0 < z \leq 3$)), which reduces oxide growth during the subsequent photoresist stripping process.

Figure 10:
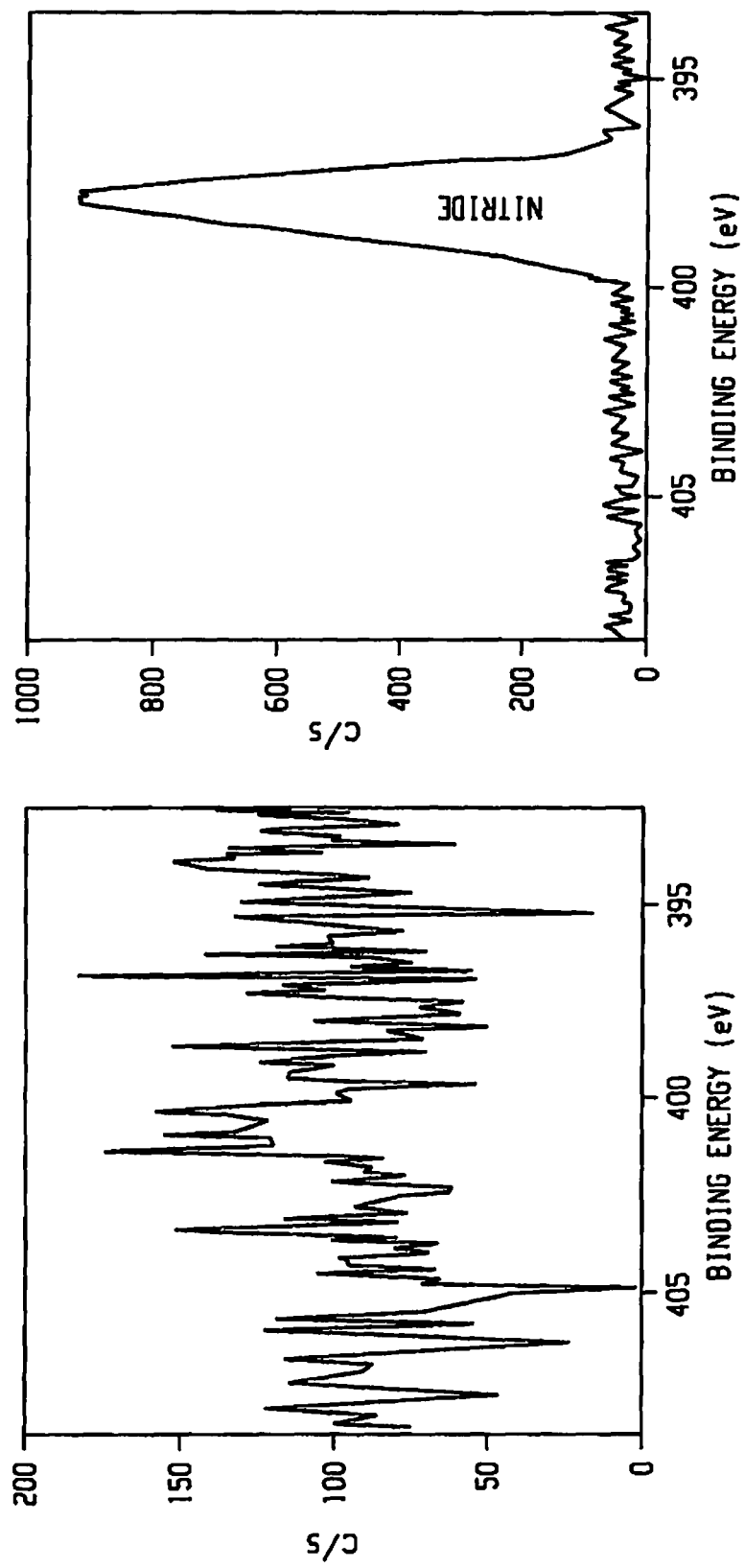
FIG. 10 graphically illustrates high resolution XPS spectra of nitrogen, N (Is), for silicon substrates processed with and without exposure to $UV-NH_3$.

FIG. 10 shows high resolution XPS spectrum the binding energies for the N (Is) signal for the samples with and without the exposure to the pretreatment process (helium plus 100 ppm $NH_3$). The data provides evidence that surface nitride forms on the silicon surface after exposure to the pretreatment process.

It will be understood that when an element is referred to as being "on" another element, it can be directly on the other element or intervening elements can be present therebetween. In contrast, when an element is referred to as being "disposed on" or "formed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the embodiments of the invention belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

While embodiments of the invention have been described with reference to exemplary embodiments, it will be understood by those skilled in the art that various changes can be made and equivalents can be substituted for elements thereof without departing from the scope of the embodiments of the invention. In addition, many modifications can be made to adapt a particular situation or material to the teachings of embodiments of the invention without departing from the essential scope thereof. Therefore, it is intended that the embodiments of the invention not be limited to the particular embodiment disclosed as the best mode contemplated for carrying out this invention, but that the embodiments of the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for performing plasma-mediated stripping, comprising:
   providing a substrate, the substrate having a surface with first portions and second portions, wherein the first portions of the surface are covered with a material and the second portions of the surface are exposed and free of the material;
   forming a protective layer on the second portions of the surface that are free of the material before and/or during the plasma-mediated stripping,
   wherein the forming the protective layer on the second portions of the surface comprises exposing the second portions of the surface to plasma formed from a nitrogen containing gas and/or a carbon containing gas or exposing the second portions of the surface to ultraviolet radiation and the nitrogen containing gas and/or the carbon containing gas;
   removing each of (i) a first portion of the material covering the first portions of the surface and (ii) the protective layer formed on the second portions of the surface with the plasma-mediated stripping; and
   repeating the forming the protective layer and the removing until a predetermined amount of the material is removed from the first portions of the surface,
   wherein repeating the forming the protective layer and the removing includes:
      subsequent to removing the first portion of the material from the first portions of the surface and the protective layer from the second portions of the surface, forming the protective layer a second time on the second portions of the surface; and
      removing a second portion of the material from the first portions of the surface and the protective layer from the second portions of the surface formed the second time.

2. The method of claim 1, wherein the material includes a photoresist and/or an anti-reflective coating.

3. The method of claim 1, wherein the forming the protective layer comprises depositing the protective layer onto the second portions of the surface.

4. The method of claim 1, wherein the forming the protective layer comprises passivating the second portions of the surface.

5. The method of claim 1, wherein the nitrogen containing gas comprises $N_2$, $NH_3$, NO, $N_2O_3$, $N_2O$, nitrogen containing hydrocarbons, or mixtures thereof.

6. The method of claim 1, wherein the carbon containing gas comprises $CO_2$, $CH_4$, HCN, $C_2O$, CO, or mixtures thereof.

7. The method of claim 1, wherein the removing comprises exposing the substrate to an oxygen-based plasma.

8. The method of claim 1, wherein the removing comprises exposing the substrate to plasma including oxygen and forming gas.

9. The method of claim 1, wherein the forming the protective layer and the removing occur in less than one second.

10. A method for performing plasma-mediated stripping, comprising:
   providing a substrate, the substrate including a surface with first portions and second portions, wherein the first portions of the surface have a mask of an organic material disposed thereon and the second portions of the surface are exposed and free of the mask;
   forming a protective layer on the second portions of the surface that are free of the mask before and/or during the plasma-mediated stripping,
   wherein the forming the protective layer on the second portions of the surface comprises exposing the second portions of the surface to ultraviolet radiation and an inert gas, a nitrogen containing gas or a carbon containing gas;
   removing each of (i) at least a first portion of the mask from the first portions of the surface and (ii) the protective layer formed on the second portions of the surface with the plasma-mediated stripping; and
   repeating the forming the protective layer and the removing until a predetermined amount of the mask is removed from the first portions of the surface,
   wherein repeating the forming the protective layer and the removing includes:
      subsequent to removing the first portion of the material from the first portions of the surface and the protective layer from the second portions of the surface, forming the protective layer a second time on the second portions of the surface; and
      removing a second portion of the material from the first portions of the surface and the protective layer formed the second time from the second portions of the surface.

11. The method of claim 10, wherein the organic material includes a photoresist and/or an anti-reflective coating.

12. The method of claim 10, wherein the forming the protective layer comprises depositing the protective layer onto the second portions of the surface free of the mask.

13. The method of claim 10, wherein the forming the protective layer comprises passivating the second portions of the surface free of the mask.

14. The method of claim 10, wherein the nitrogen containing gas comprises $N_2$, $NH_3$, NO, $N_2O_3$, $N_2O$, nitrogen containing hydrocarbons, or mixtures thereof.

15. The method of claim 10, wherein the inert gas is selected from a group consisting of helium, argon, nitrogen, krypton xenon, and neon.

16. The method of claim 10, wherein the carbon containing gas comprises $CO_2$, $CH_4$, HCN, $C_2O$, CO, CO or mixtures thereof.

17. The method of claim 10, wherein the removing comprises exposing the substrate to oxidizing plasma or reducing plasma.

18. A method for processing a substrate, comprising:
   a) arranging a substrate including masked portions and unmasked portions in a process chamber;
   b) creating plasma in a process chamber;
   c) supplying a passivation gas mixture that includes nitrogen or carbon to create a plasma passivation gas mixture;
   d) exposing the substrate to the plasma passivation gas mixture to create a passivation layer on the unmasked portions of the substrate;
   e) supplying a stripping gas mixture that includes oxygen to the plasma to create a plasma stripping gas mixture;
   f) exposing the substrate to the plasma stripping gas mixture to strip at least part of the masked portions and at least part of the passivation layer; and
   g) repeating c) to f) to remove a predetermined amount of the masked portions,
   wherein repeating c) and f) includes:
      subsequent to exposing the substrate to the plasma stripping gas mixture to strip at least part of the masked portions and at least part of the passivation layer, supplying the passivation gas mixture a second time to create the passivation layer on the unmasked portions of the substrate; and
      exposing the substrate to the plasma stripping gas mixture a second time to strip at least part of the masked portions and at least part of the passivation layer.

19. The method of claim 18, further comprising exposing the substrate to UV radiation during f).

20. The method of claim 18, wherein the stripping gas mixture further includes forming gas.

21. The method of claim 18, wherein the stripping gas mixture further includes nitrogen.

* * * * *